United States Patent
Liu

(10) Patent No.: US 10,304,883 B2
(45) Date of Patent: May 28, 2019

(54) COLOR FILTER ARRAY AND IMAGE SENSING DEVICE USING THE SAME

(71) Applicant: PIXART IMAGING INC., Hsin-Chu (TW)

(72) Inventor: Chia-Yu Liu, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

(21) Appl. No.: 15/440,101

(22) Filed: Feb. 23, 2017

(65) Prior Publication Data

US 2017/0330910 A1    Nov. 16, 2017

(30) Foreign Application Priority Data

May 13, 2016    (TW) .............................. 105114885 A

(51) Int. Cl.
*H01L 27/146*    (2006.01)
*H01L 31/0216*    (2014.01)

(52) U.S. Cl.
CPC .. *H01L 27/14621* (2013.01); *H01L 27/14625* (2013.01); *H01L 27/14627* (2013.01); *H01L 27/14645* (2013.01); *H01L 31/02162* (2013.01); *H01L 31/02165* (2013.01)

(58) Field of Classification Search
CPC ......... H01L 27/14621; H01L 27/14625; H01L 27/14645; H01L 31/02162; H01L 31/02165

USPC ......................................... 257/294, 432, 440
See application file for complete search history.

(56) References Cited

U.S. PATENT DOCUMENTS

| 2009/0230492 A1* | 9/2009 | Yamamoto | H01L 27/14603 257/432 |
| 2016/0118430 A1* | 4/2016 | Nam | H01L 27/14627 257/432 |

* cited by examiner

*Primary Examiner* — Matthew E Warren
(74) *Attorney, Agent, or Firm* — Li & Cai Intellectual Property (USA) Office

(57) ABSTRACT

A color filter array and an image sensing device are disclosed. The color filter array includes a plurality of color cells arranged into a matrix. Each color cell has an intermediate region and a peripheral region. The peripheral region is configured around the intermediate region. The intermediate region forms a color filter object. Parts of the peripheral region form transparent objects. The transparent objects extend to edge parts of the color cells from an edge of the intermediate region. The remaining peripheral regions form the color filter objects. The color filter object is a high-refractive index material. The transparent object is a low-refractive index material. Therefore, in each color cell, the color filter objects configured in the intermediate region and the peripheral region reduce the spectral crosstalk, and the transparent objects configured in the peripheral region reduce the optical crosstalk, thereby enhancing the image quality sensed by sensor chips.

18 Claims, 7 Drawing Sheets

120

10

COLOR FILTER ARRAY AND IMAGE SENSING DEVICE USING THE SAME

BACKGROUND

1. Technical Field

The present disclosure relates to a color filter array and an image sensing device using the same, and in particular, to a color filter array and an image sensing device using the same for reducing the spectral crosstalk.

2. Description of Related Art

The image sensing device is one of the main components for electro-optical devices, e.g., digital cameras, smart phones, etc. The conventional image sensing device is divided into two types of image sensing devices, i.e., the charge coupled device (CCD) sensor and the complementary metal-oxide-semiconductor (CMOS) sensor. The image sensing device usually includes micro-lenses, a color filter array, and sensor chips.

The color filter array is arranged by a plurality of sub-pixel arrays. The sub-pixel arrays are a periodic pattern, which is composed of a red (R) color filter object, green (G) color filter object, and blue (B) color filter object. When a light illuminates the color filter array through the lens, there is lower spectral crosstalk among the corresponding red spectrum, the corresponding green spectrum, and the corresponding blue spectrum. However, due to the diffraction phenomenon, photons illuminated on the color filter object will move to the adjacent pixel to cause optical crosstalk, thereby generating a color cast and reducing image resolution.

Therefore, in another conventional color filter array, the sub-pixel arrays are a periodic pattern, which is composed of a red (R) color filter object, a green (G) color filter object, and a blue (B) color filter object. In addition, a low-refractive index material is formed around each color filter object so as to isolate each color filter object, so as to avoid optical crosstalk among the adjacent color filter objects. However, this kind of color filter array will cause serious spectral crosstalk due to the full transmittance of the low-refractive index material, thereby reducing the pure color of red spectrum, the pure color of green spectrum, and the pure color of blue spectrum and decreasing the image saturation and the signal to noise ratio (SNR).

Therefore, if an image sensing device can decrease optical crosstalk and spectral crosstalk simultaneously, the image quality sensed by sensor chips can be enhanced.

SUMMARY

Accordingly, an objective of the present disclosure is to provide a color filter array and an image sensing device using the same, which simultaneously reduce optical crosstalk and spectral crosstalk by configuring the color filter object and the object with the low-refractive index material on the color filter array, thereby enhancing the image quality sensed by sensor chips.

An exemplary embodiment of the present disclosure provides a color filter array. The color filter array includes a plurality of color cells. The color cells are arranged into a matrix. Each color cell has an intermediate region and a peripheral region. The peripheral region is configured around the intermediate region. The intermediate region forms a color filter object. Parts of the peripheral region form transparent objects. The transparent objects extend to edge parts of the color cells from an edge of the intermediate region. The remaining peripheral regions form the color filter objects. Each color filter object is a high-refractive index material, and each transparent object is a low-refractive index material.

An exemplary embodiment of the present disclosure provides an image sensing device. The image sensing device includes a semiconductor substrate, a color filter array, and a plurality of micro-lenses. A plurality of sensor chips are configured on the semiconductor substrate. The color filter array is configured on the semiconductor substrate. The color filter array has a plurality of color cells arranged into a matrix. Each color cell has an intermediate region and a peripheral region. The peripheral region is configured around the intermediate region. The intermediate region forms a color filter object. Parts of the peripheral region form transparent objects. The transparent objects extend to edge parts of the color cells from edges of the intermediate region. The remaining peripheral regions form the color filter objects. The color filter object is a high-refractive index material, and the transparent object is a low-refractive index material. The micro-lenses are respectively configured on the color cells.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
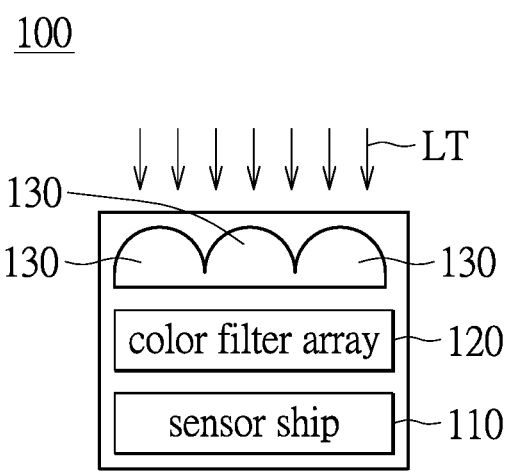
FIG. 1 is a diagram of an image sensing device according to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

This embodiment provides a color filter array having a plurality of color cells and an image sensing device using the same. In each color cell, the intermediate region and parts of the peripheral region form color filter objects, and the remaining peripheral regions form transparent objects. The color filter objects are high-refractive index materials and the transparent objects are low-refractive index materials. Therefore, in each color cell, the peripheral region formed from the color filter objects and the transparent objects has advantages of two conventional sub-pixel arrays to simultaneously reduce optical crosstalk and spectral crosstalk, thereby enhancing the image quality sensed by sensor chips. The color filter array and the image sensing device using the same provided in the exemplary embodiment of the present disclosure will be described in the following paragraphs.

Figure 2A:
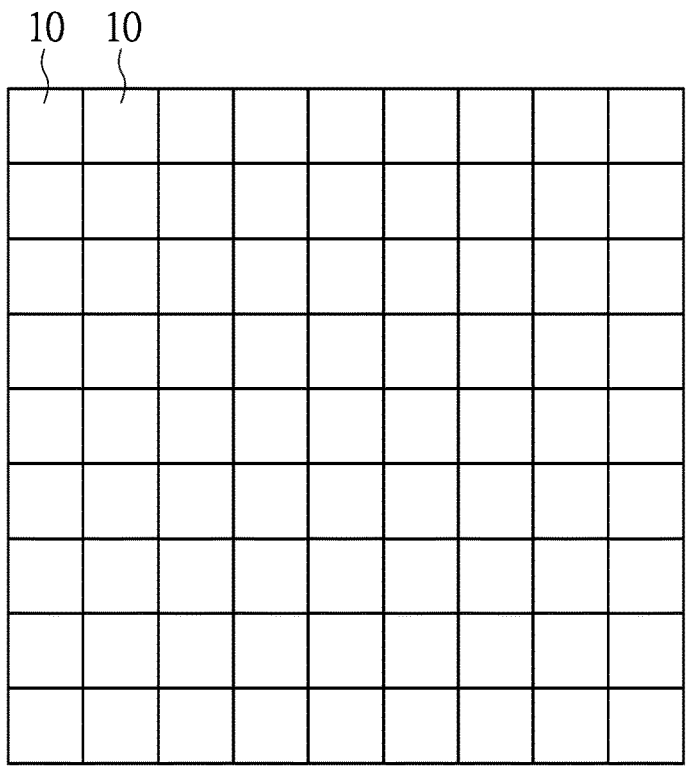
FIG. 2A is a diagram of a color filter array according to an exemplary embodiment of the present disclosure.

Referring to FIGS. 1 and 2A, FIG. 1 shows a diagram of an image sensing device according to an exemplary embodiment of the present disclosure, and FIG. 2A shows a diagram of a color filter array according to an exemplary embodiment of the present disclosure. The image sensing device 100 includes a semiconductor substrate, a color filter array 120, and a plurality of micro-lenses 130. A plurality of sensor chips 110 are configured on the semiconductor substrate. The color filter array 120 is configured on the sensor chips 110 and has a plurality of color cells 10. The micro-lenses 130 are respectively configured on each of the color cells 10. Therefore, after a light LT enters the micro-lenses 130, the color filter array 120 filters the light LT to allow specific wavelengths of light to pass. Next, the sensor chips 110 configured on the semiconductor substrate senses the intensity of the light LT and then converts the analog signal (indicating the intensity of the light LT) into a digital signal by photoelectric conversion to acquire the target image. Then, the processor (not shown in FIGS.) processes the target image and then generates an output image to execute the subsequent operation (e.g., displaying the output image).

Figure 2B:
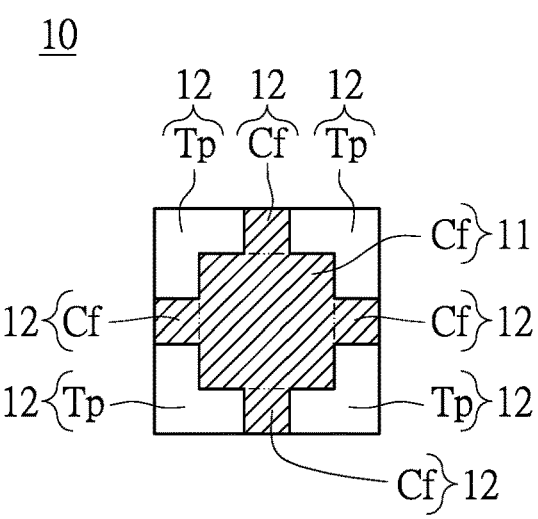
FIG. 2B is a diagram of a color cell according to an exemplary embodiment of the present disclosure.

It is worth noting that the color cells 10 of the color filter array 120 are arranged into a matrix. In the present disclosure, the size of the matrix is 9×9. Referring to FIG. 2B, which shows a diagram of a color cell according to an exemplary embodiment of the present disclosure, each color cell 10 includes the intermediate region 11 and the peripheral region 12. The intermediate region 11 forms the color filter object Cf. Parts of the peripheral region 12 form transparent objects Tp, and the transparent objects Tp extend to parts of the edge of the color cells 10 from an edge of the intermediate region 11. The remaining peripheral regions 12 form the color filter objects Cf. In the present disclosure, in each color cell 10, the transparent objects Tp are symmetrically configured around parts of the intermediate region 11 to uniformly filter the light LT. The color filter objects Cf are used for filtering away a specific wavelength of the light LT to allow light corresponding to the color of the color filter objects Cf to pass. For example, when the color filter objects Cf are red filter objects, only the red light can pass. The transparent objects Tp allows a variety of wavelengths of light to pass. Accordingly, the color filter objects Cf can be configured to be in other colors according to practical requirements, and the present embodiment is not limited thereto.

In addition, the color filter object Cf is a high-refractive index material, and the transparent object Tp is a low-refractive index material. The light LT enters each color cell 10 from all angles. Therefore, when the light LT enters the low-refractive index material (i.e., the transparent object Tp) from the high-refractive index material (i.e., the color filter object Cf), the light LT will generate total reflection, so that photons illuminated on the color filter object will not move to the adjacent color cells 10 and cannot form optical crosstalk.

Accordingly, in each color cell, the color filter object of the intermediate region and the color filter object of the peripheral region can reduce spectral crosstalk, and the transparent object of the peripheral region can reduce optical crosstalk, thereby enhancing the image quality sensed by sensor chips 110.

Figure 3A:
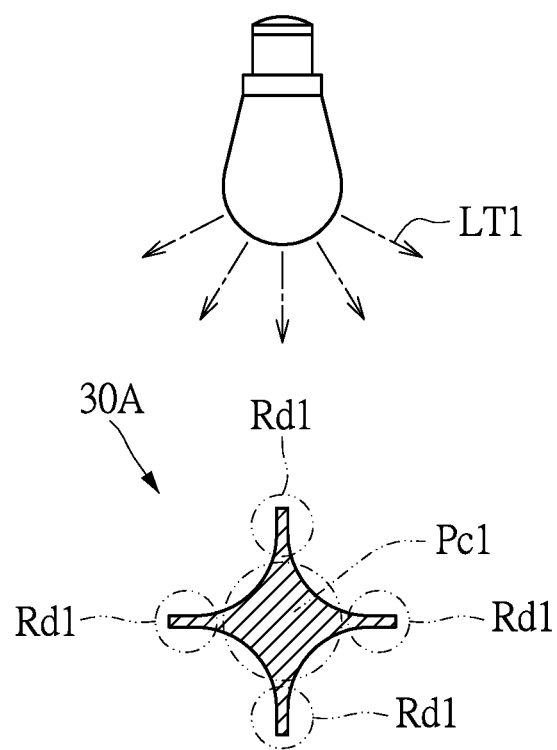
FIG. 3A is a diagram of a light field of a light projecting on a color cell through a micro-lens according to an exemplary embodiment of the present disclosure.
Figure 3B:
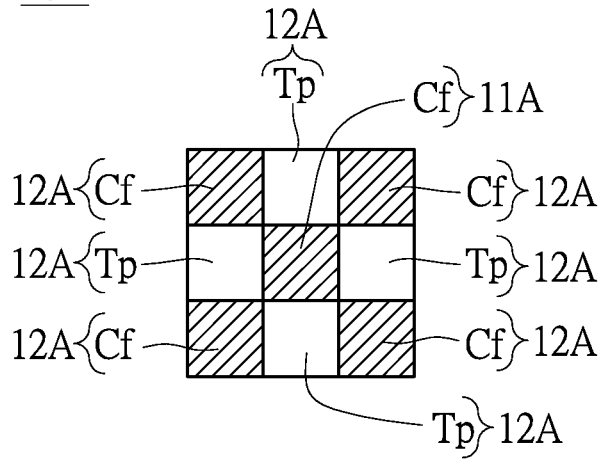
FIG. 3B is a diagram of a color cell of FIG. 3A.

In another embodiment, the transparent object Tp of each color cell 10 can be configured around parts of the intermediate region 11 according to a light field of a light LT1 passing through the corresponding micro-lens 130 and projecting on the corresponding color cell 10. Referring to FIG. 3A in conjunction with FIG. 1, the light field 30A is in the shape of the light LT1 projecting on the corresponding color cell. The light field 30A has a concentrated portion Pc1 (the area where the light concentrates) and four astigmatism portions Rd1 (the area where the light cannot concentrate). Due to the four astigmatism portions Rd1 being taken as one of the sources of optical crosstalk, the transparent objects Tp are configured on the four astigmatism portions Rd1 to reduce optical crosstalk. In the present disclosure, as shown in FIG. 3B, the shape of the intermediate region 11A of each color cell 10A is quadrilateral, and the intermediate region 11A forms a color filter object Cf. The transparent objects Tp are configured on four sides of the quadrilateral (i.e., parts of the peripheral region 12A corresponding to four astigmatism portions Rd1), and the width of each of the transparent objects Tp is equal to the side length of the quadrilateral. The remaining peripheral regions 12A form color filter objects Cf.

Figure 3C:
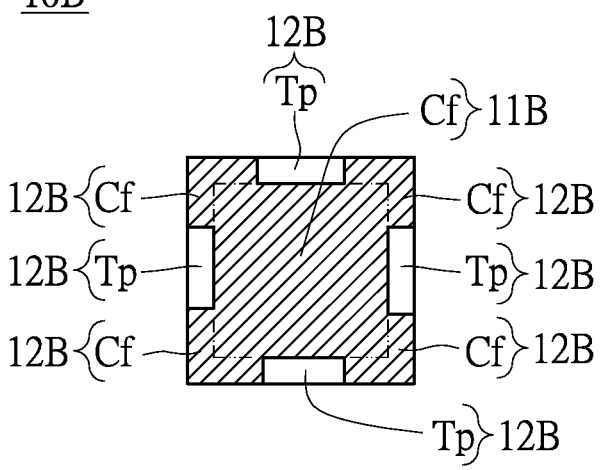
FIG. 3C is a diagram of another color cell of FIG. 3A.

In addition, due the width of the four astigmatism portions Rd1 being less than the side length of the quadrilateral, the width of the transparent objects Tp can be configured to be less than the side length of the quadrilateral to increase the area of the color filter objects configured on the peripheral region. As shown in FIG. 3C, the shape of the intermediate region 11B of each color cell 10B is quadrilateral, and the intermediate region 11B forms the color filter object Cf. The transparent objects Tp are configured on four sides of the quadrilateral (i.e., parts of the peripheral region 12B corresponding to four astigmatism portions Rd1), and the width of each transparent objects Tp is less than the side length of the quadrilateral. The remaining peripheral regions 12B form color filter objects Cf.

Accordingly, in each color cell, the position of the transparent object Tp formed on the peripheral region can be configured by the shape of the light projecting on the corresponding color cell, so as to avoid the four astigmatism portions Rd1 interfering with the adjacent color cells. In addition, the area of the color filter objects Cf formed on the peripheral region 12B shown in FIG. 3C is bigger than the area of the color filter objects Cf formed on the peripheral region 12A shown in FIG. 3B. The color cell 10B can reduce more optical crosstalk, so that the sensor chips 110 can sense better image quality.

Figure 4A:
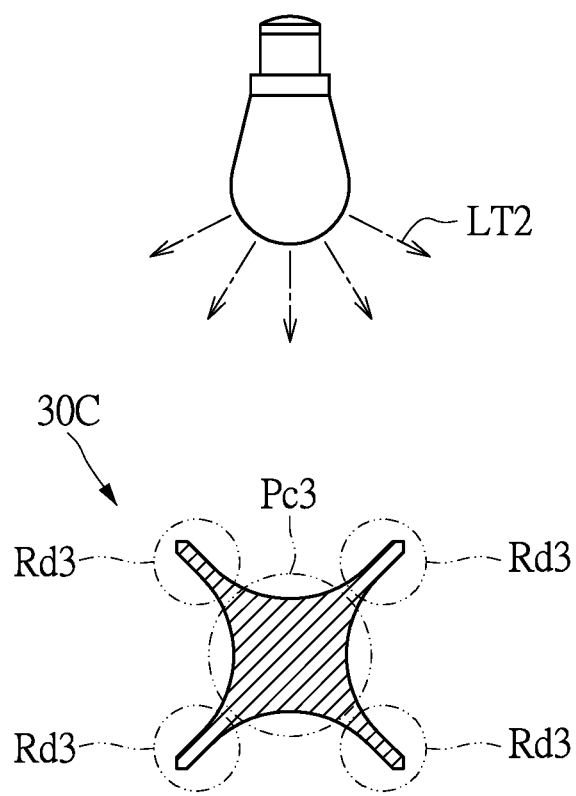
FIG. 4A is a diagram of a light field of a light projecting on a color cell through a micro-lens according to another exemplary embodiment of the present disclosure.
Figure 4B:
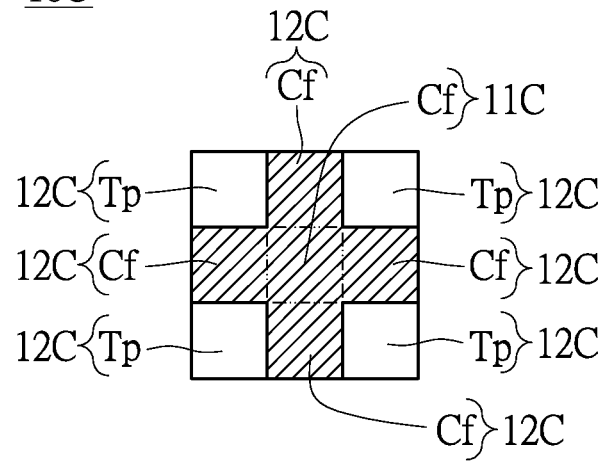
FIG. 4B is a diagram of one color cell of FIG. 4A.

Referring to FIG. 4A in conjunction with FIG. 1, in another embodiment of the present disclosure, the light field 30C of the light LT2 projecting on the corresponding color cell shown in FIG. 4A is different from the light field 30A shown in FIG. 3A. More specifically, the light field 30C has a concentrated portion Pc3 (the area where the light concentrates) and four astigmatism portions Rd3 (the area where the light cannot concentrate). As shown in FIG. 4B, the intermediate region 11C of each color cell 10C is quadrilateral and the intermediate region 11C forms the color filter object Cf. The transparent objects Tp are configured on four corners of the quadrilateral (i.e., parts of the peripheral region 12C corresponding to four astigmatism portions Rd3). The remaining peripheral regions 12C form color filter objects Cf.

Figure 4C:
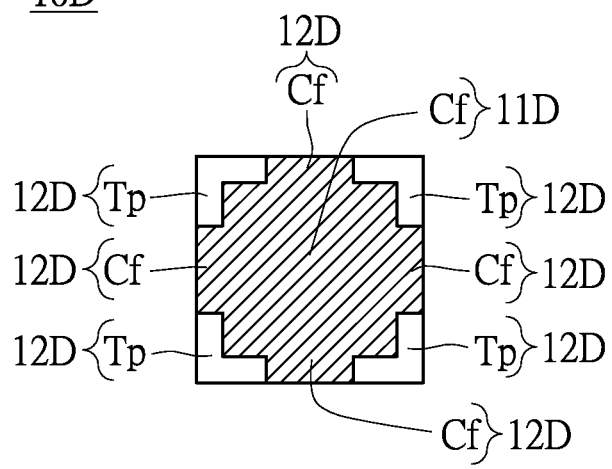
FIG. 4C is a diagram of one color cell of FIG. 4A.

Similarly, each transparent object Tp can extend to the adjacent side of the quadrilateral to increase the area of the transparent object Tp configured on the peripheral region. As shown in FIG. 4C, the intermediate region 11D of each color cell 10D is quadrilateral, and the intermediate region 11D forms the color filter object Cf. The transparent objects Tp are configured on four corners of the quadrilateral (i.e., parts of the peripheral region 12D corresponding to four astigmatism portions Rd3), and the transparent objects Tp extend to the adjacent sides of the quadrilateral. The remaining peripheral regions 12D form color filter objects Cf.

Accordingly, in each color cell, the position of the transparent object Tp formed on the peripheral region can be configured by the shape of the light projecting on the corresponding color cell to avoid the four astigmatism portions Rd3 interfering with the adjacent color cells. Compared with the transparent objects Tp shown in FIG. 4B, the transparent objects Tp extending to the adjacent sides of the quadrilateral shown in FIG. 4C can further reduce optical crosstalk, so that the sensor chips 110 can sense better image quality.

In another embodiment, in each color cell, the position of the transparent objects Tp configured on the peripheral region is related to the position of the corresponding color cell on the matrix. As shown in FIG. 5A, the color cells of the color filter array 120A are arranged into a matrix. The light illuminates on the color filter array 120A. The chief ray angles of the light projecting on each color cell are different. Therefore, in each color cell, the positions of the transparent objects Tp formed on the peripheral region are adaptively adjusted according to the different chief ray angles. That is, in each color cell, the position of the transparent objects Tp configured on the peripheral region is adjusted according to the position of the corresponding color cell on the matrix.

Taking the color cells 10E, 10F, 10G, and 10H shown in FIG. 5A as an example, the position of the color cell 10E in the matrix is defined as (0, 0); the position of the color cell 10F in the matrix is defined as (4, 0); the position of the color cell 10G in the matrix is defined as (0, 4); and the position of the color cell 10H in the matrix is defined as (4, 4).

Figure 5D:
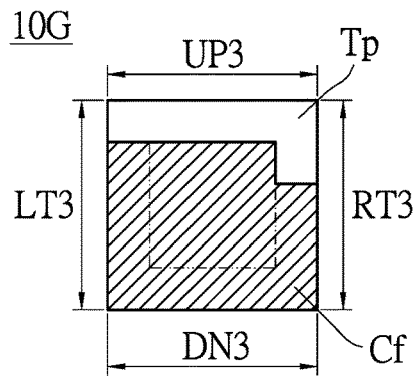
FIG. 5D is a diagram of one color cell of FIG. 5A.
Figure 5E:
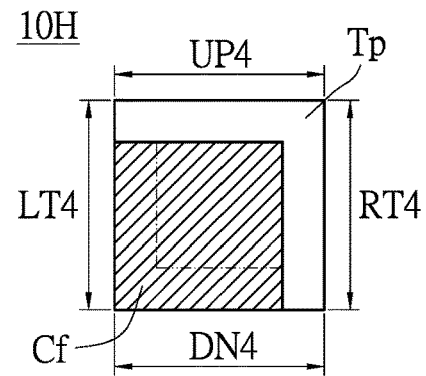
FIG. 5E is a diagram of one color cell of FIG. 5A.
Figure 5A:
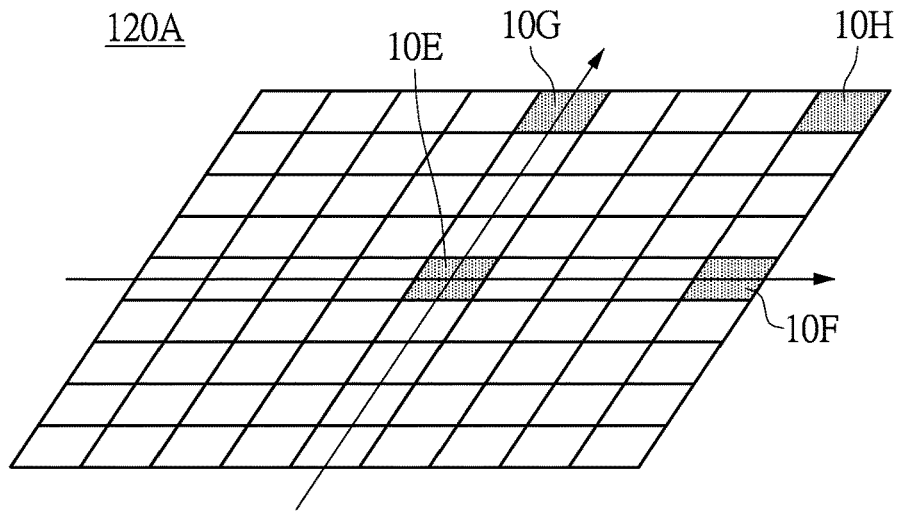
FIG. 5A is a diagram of a color filter array according to another exemplary embodiment of the present disclosure.
Figure 5B:
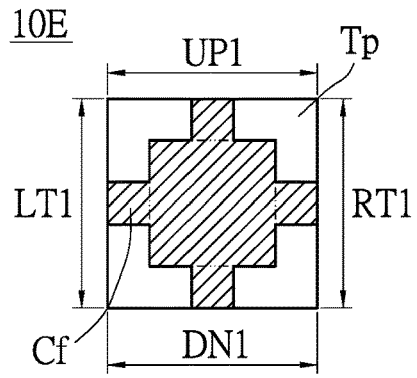
FIG. 5B is a diagram of one color cell of FIG. 5A.

As shown in FIG. 5B, which shows the color cell 10E. The peripheral region of the color cell 10E has an upper portion UP1, a lower portion DN1, a left portion LT1, and a right portion RT1 to surround the intermediate region. The color cell 10E is located at (0, 0) of the matrix. Therefore, in the color cell 10E, the peripheral region corresponding to four corners of the intermediate region form the transparent object Tp, and the intermediate region and the remaining peripheral regions form the color filter object Cf.

Figure 5C:
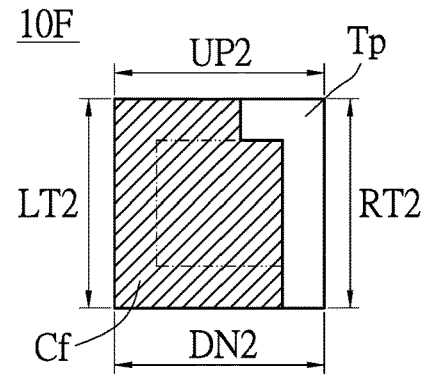
FIG. 5C is a diagram of one color cell of FIG. 5A.

As shown in FIG. 5C, which shows the color cell 10F, the peripheral region of the color cell 10F has an upper portion UP2, a lower portion DN2, a left portion LT2, and a right portion RT2 to surround the intermediate region. The color cell 10F is located at (4, 0) of the matrix. Therefore, in the color cell 10F, the right portion RT2 of the peripheral region forms the transparent object Tp. The upper portion UP3 close to the right portion RT2 of the peripheral region forms the transparent object Tp. The intermediate region and the remaining peripheral regions form the color filter object Cf.

As shown in FIG. 5D, which shows the color cell 10G, the peripheral region of the color cell 10G has an upper portion UP3, a lower portion DN3, a left portion LT3, and a right portion RT3 to surround the intermediate region. The color cell 10G is located at (4, 0) of the matrix. Therefore, in the color cell 10G, the upper portion UP3 of the peripheral region forms the transparent object Tp. The right portion RT3 close to the upper portion UP3 of the peripheral region forms the transparent object Tp. The intermediate region and the remaining peripheral regions form the color filter object Cf.

As shown in FIG. 5E, which shows the color cell 10H, the peripheral region of the color cell 10H has an upper portion UP4, a lower portion DN4, a left portion LT4, and a right portion RT4 to surround the intermediate region. The color cell 10H is located at (4, 4) of the matrix. Therefore, in the color cell 10H, the upper portion UP4 of the peripheral region forms the transparent object Tp. The right portion RT4 of the peripheral region forms the transparent object Tp. The intermediate region and the remaining peripheral regions form the color filter object Cf.

The configurations for adjusting the position of the transparent object Tp in each color cell on the peripheral region can be derived from FIGS. 5B-5E. When the color cell is configured on an upper position of the matrix, the width of the transparent objects formed on the upper portion is longer. When the color cell is configured on a lower position of the matrix, the width of the transparent objects formed on the lower portion is longer. When the color cell is configured on a leftward position of the matrix, the width of the transparent objects formed on the left portion is longer. When the color cell is configured on a rightward position of the matrix, the width of the transparent objects formed on the right portion is longer.

Accordingly, in each color cell, the position of the transparent objects Tp configured on the peripheral region will be adjusted to suit the angle of the light projecting on the corresponding color cell according to the position of the corresponding color cell located at the matrix.

In summary, the invention provides a color filter array and an image sensing device using the same. In each color cell, the color filter object formed on the intermediate region and the peripheral region can reduce optical crosstalk. The transparent object of the peripheral region can reduce spectral crosstalk. Therefore, it can enhance the image quality sensed by the sensor chips.

The abovementioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A color filter array, comprising:
   a plurality of color cells, arranged into a matrix, each color cell having an intermediate region and a peripheral region, the peripheral region being configured around the intermediate region;
   wherein the intermediate region of each color cell includes a first color filter object, parts of the peripheral region of each color cell include a plurality of transparent objects, the transparent objects extend to edge parts of each of the color cells from an edge of the intermediate region, and another part of the peripheral region of each color cell includes a second color filter object;

wherein each of the first and second color filter objects is a high-refractive index material, and each of the transparent objects is a low-refractive index material.

2. The color filter array according to claim 1, wherein in each color cell, the transparent objects are symmetrically configured around parts of the intermediate region.

3. The color filter array according to claim 1, wherein in each color cell, the transparent objects are configured around parts of the intermediate region according to a light field of a light projecting on the corresponding color cell.

4. The color filter array according to claim 1, wherein in each color cell, the shape of the intermediate region is quadrilateral, and the transparent objects are respectively configured at four sides of the quadrilateral.

5. The color filter array according to claim 4, wherein in each color cell, the width of each transparent object is less than or equal to the side length of the quadrilateral.

6. The color filter array according to claim 1, wherein in each color cell, the shape of the intermediate region is quadrilateral, and the transparent objects are respectively configured around four corners of the quadrilateral.

7. The color filter array according to claim 6, wherein each transparent object extends to the adjacent side of the quadrilateral.

8. The color filter array according to claim 1, wherein in each color cell, the positions of the transparent objects of the peripheral region is related to the position of the corresponding color cell on the matrix.

9. The color filter array according to claim 8, wherein in each color cell, the peripheral region has an upper portion, lower portion, left portion, and right portion configured around the intermediate region;
   wherein one of the transparent objects of the color cell configured on an upper position of the matrix is formed on the upper portion, and the width of the transparent object formed on the upper portion is longer;
   wherein one of the transparent objects of the color cell configured on a lower position of the matrix is formed on the lower portion, and the width of the transparent object formed on the lower portion is longer;
   wherein one of the transparent objects of the color cell configured on a leftward position of the matrix is formed on the left portion, the width of the transparent object formed on the left portion is longer; and
   wherein one of the transparent objects of the color cell configured on a rightward position of the matrix is formed on the right portion, the width of the transparent object formed on the right portion is longer.

10. An image sensing device, comprising:
   a semiconductor substrate, a plurality of sensor chips being configured on the semiconductor substrate;
   the color filter array according to claim 1, configured on the semiconductor substrate; and
   a plurality of micro-lenses, respectively configured on the color cells.

11. The image sensing device according to claim 10, wherein in each color cell, the transparent objects are symmetrically configured around parts of the intermediate region.

12. The image sensing device according to claim 10, wherein in each color cell, the transparent objects are configured around parts of the intermediate region according to a light field of a light projecting on the corresponding color cell.

13. The image sensing device according to claim 10, wherein in each color cell, the shape of the intermediate region is quadrilateral, and the transparent objects are respectively configured at four sides of the quadrilateral.

14. The image sensing device according to claim 13, wherein in each color cell, the width of each transparent object is less than or equal to the side length of the quadrilateral.

15. The image sensing device according to claim 10, wherein in each color cell, the shape of the intermediate region is quadrilateral, and the transparent objects are respectively configured around four corners of the quadrilateral.

16. The image sensing device according to claim 15, wherein each transparent object extends to the adjacent side of the quadrilateral.

17. The image sensing device according to claim 10, wherein in each color cell, the position of the transparent objects of the peripheral region is related to the position of the corresponding color cell on the matrix.

18. The image sensing device according to claim 17, wherein in each color cell, the peripheral region has an upper portion, lower portion, left portion, and right portion configured around the intermediate region;
   wherein one of the transparent objects of the color cell configured on an upper position of the matrix is formed on the upper portion, and the width of the transparent object formed on the upper portion is longer;
   wherein one of the transparent objects of the color cell configured on a lower position of the matrix is formed on the lower portion, and the width of the transparent object formed on the lower portion is longer;
   wherein when one of the transparent objects of the color cells configured on a leftward position of the matrix is formed on the left portion, the width of the transparent object formed on the left portion is longer; and
   wherein one of the transparent objects of the color cells configured on a rightward position of the matrix is formed on the right portion, the width of the transparent object formed on the right portion is longer.

* * * * *